ELECTRONIC COMPONENT AND METHOD OF MANUFACTURE THEREOF

Original Filed April 26, 1965

Inventors
Arne Carl Hansen
Arthur Painter Colburn
Carl William Uebelhoer
By Pendleton, Neuman, Seibold & Williams
Attorneys United States Patent Office Re. 26,694
Reissued Oct. 14, 1969

26,694

ELECTRONIC COMPONENT AND METHOD OF MANUFACTURE THEREOF

Arne Carl Hansen and Carl William Uebelherr, Milwaukee, Wis., and Arthur Painter Colburn, Fort Worth, Tex., assignors to Globe-Union Inc., Milwaukee, Wis., a corporation of Delaware Original No. 3,322,995, dated May 30, 1967, Ser. No. 450,584, Apr. 26, 1965. Application for reissue Oct. 23, 1967, Ser. No. 684,886

Int. Cl. H01j *17/04*

U.S. Cl. 313—325 5 Claims

Matter enclosed in heavy brackets [ ] appears in the origginal patent but forms no part of this reissue specification; matter printed in italics indicates the additions made by reissue.

*ABSTRACT OF THE DISCLOSURE*

*An electricial component, including a spark gap formed by two flexible conductors supported on the component, is described. The portions of the flexible conductors between the spark gap and the supporting positions are relatively short to provide a rigid spark gap assembly. In one embodiment the other ends of the flexible conductors are relatively long to facilitate fastening within an electrical circuit. The spark gap may be made part of an electrical component, such as a capacitor, and the two lead wires for the capacitor may serve as the conductors for the spark gap.*

This invention relates to an improved electronic component and more particularly to an electronic component having improved physical and electrical characteristics and being capable of improved overvoltage protection.

This invention also relates to an improved method of manufacturing electronic components and particularly to methods of raising the efficiency of manufactiuring while improving the reliability of resulting products. The method has particular application to an electronic component which includes a spark gap for overvoltage protection.

The term "electronic component" is used in industry to designate a wide variety of products utilized in the construction of electronic and electric circuits. It is for all germane purposes synonymous with "electric component." While the most usual electronic components encountered are perhaps resistors, capacitors and inductors, the gamut of components is unlimited and includes such things as vacuum tubes, transistors, connectors, printed circuit boards, circuit protective devices, such as fuses and spark gaps, transformers and the like. Such components are wired together or interconnected electrically to produce more complex components, circuits and, ultimately complete electronic equipment.

The electronic components must have electrical terminations whereby they are adapted for interconnection. In a wide variety of components, the termination comprises a flexible, conductive terminal composed of round or ribbon-like resilient material. Such terminal conductors should be strong but flexible and should have good conductivity. One typical terminal conductor is formed of a copper alloy tinned to facilitate soldering.

It is often desirable to include overvoltage protection in components which are basically adapted for other purposes. One technique for providing overvoltage protection is to provide a small spark gap in the component so that in the event of excessive voltage an arc will be generated across the gap reducing the voltage thereacross before serious damage to the components results. Such a component is preferably self-healing once the excessive voltage is removed and the component will thus continue to function as before. One very satisfactory component which comprises a combined resistor, capacitor and spark gap is shown in Magnusson et al. Pat. No. 2,966,608.

It is one object of this invention to provide an improved method for the manufacture of electronic components which include flexible terminal conductors.

It is another object of this invention to provide an improved method of manufacturing electroinc componets which facilitates the use of automatic practices and results in a more reliable and electrically stable product.

Another object of this invention is the production of an improved component including a protective element which functions in the event of the application of excessive voltage thereto.

Still another object of this invention is the production of an improved electronic component with an over-voltage protector which is capable of performing multiple functions, is simple, inexpensive and reliable.

A further object of this invention is the production of an electric component having an overvoltage protector which is self-restoring, easily maintained, cleanable, designed to avoid contamination and "tracking." "Tracking" is the formation of a low impedance current path as a result of arcing between the electrodes of a spark gap.

It is still another object of this invention to provide an improved electric circuit component having overvoltage protection which is controllable and wherein the voltage value at which the overvoltage protector functions can be readily controlled.

Further and additional objects of this invention will become manifest from a consideration of this description, the accompanying drawings and the appended claims.

In one form of this invention a ceramic disk is provided with conductive films fused to the opposed flat surfaces of the disk. A terminal assembly including two legs and a bight portion is shaped to define entrapping surfaces between the legs, and the ceramic disk is inserted and held in position by the somewhat resilient terminal assembly. The respective legs of the terminal assembly are thereafter fused to the conductive faces of the ceramic body to produce rigid and electrically conductive connections. Thereafter the bight portion of the terminal assembly is either severed to form two distal ends defining a spark gap or removed and the complete assembly of the ceramic body and the terminal conductors fused thereto is encapsulated with an appropriate insulating material.

In the event a spark gap is included in the component, it is appropriate to encapsulate the component prior to severing the bight portion whereby a slot is formed through both the bight portion and the encapsulation to provide an air gap. The resulting product is a completely encapsulated capacitor in which the ceramic body provides a dielectric and the conductive films provide plates or electrodes for a capacitor. The spark gap is in parallel with the capacitor and the voltage breakdown characteristics are dependent upon the width of the gap.

For a more complete understanding of this invention reference will now be made to the drawing wherein.

Figure 1:
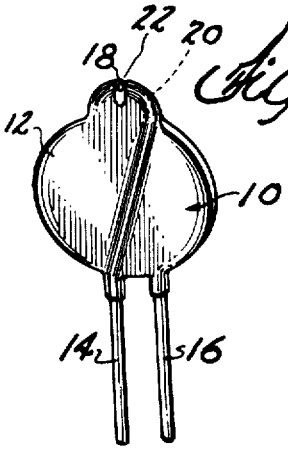
FIG. 1 is a perspective view of one embodiment of this invention.

Referring now to the drawing and more particularly to FIG. 1, a capacitor 10 is illustrated having a housing 12 and a pair of flexible terminal conductors 14 and 16. The capacitor 10 also includes overvoltage protection in the form of a pair of conductive electrodes 18 and 20 disposed adjacent the periphery of the capacitor, encapsulated by the housing 12 and providing a spark gap 22. The internal construction of the capacitor of FIG. 1 can be best seen in FIG. 2 where the encapsulating housing 12 is removed with the outline thereof shown in broken lines. Therein the internal construction is clearly shown including the terminal conductor 14 and the intermediate portion 30 extending diagonally therefrom across one face of the ceramic disk 24 and terminating in the spark gap electrode 20. The disk 24 may be of any desired material such as various titanates, steatite or other ceramic materials and will generally have substantially parallel surfaces to insure a predetermined capacitance when the ceramic becomes the dielectric of a completed capacitor. Titanates are desirable because of their electrical properties including a relatively high dielectric constant, high specific resistivity, low losses and high voltage breakdown characteristics. For example, a typical ceramic capacitor having a diameter of about ⅜ inch will have a capacitance between 5 and 5,000 picofarads and a voltage breakdown of several thousand volts.

Figure 3:
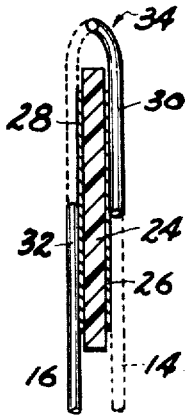
FIG. 3 is an enlarged cross-sectional view of the electronic component of FIG. 1 taken on line 3—3 of FIG. 2.

In one preferred technique of manufacturing the described component, a silver paint including particulate silver and a glass "frit" is applied to the two parallel faces of the ceramic 24 to define electrodes or plates 26 and 28. The electrodes 26 and 28 are shown in FIG. 3 and are fired onto the body 24 by any of several known techniques. The intermediate portion 30 of the terminal assembly is fused to the electrode 26 by any of several well-known techniques also. The techniques include pasting or soldering. The connection between the intermediate terminal portion 30 and the electrode 26 should be mechanically rigid and of very low electrical resistance. An intermediate portion 32 of the opposed leg 16 is similarly fused to the electrode 28.

Figure 2:
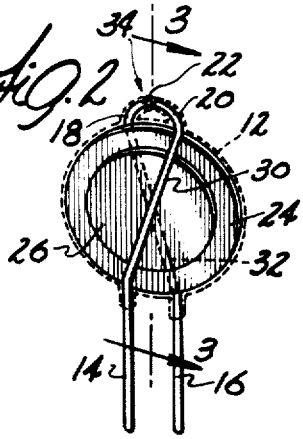
FIG. 2 is a diagrammatic view of the electronic component of FIG. 1 showing the encapsulating housing in broken lines to reveal the internal construction.

As shown clearly in FIG. 2, the two intermediate portions when considered in plan view define a cross and during assembly these two intermediate portions are connected together by a shaped bight portion 34. During assembly the bight portion is continuous and the terminal conductors 14 and 16, intermediate portions 30 and 32 and bight portion 34 are formed from a single piece of wire.

The terminal assembly as described above has sufficient resiliency to support the ceramic disk 24 when placed between the intermediate portions 30 and 32. Thus manufacture of the component is greatly facilitated and may be easily subjected to completely automatic processes.

Upon applying the painted electrodes 26 and 28 to the ceramic disk 24, the disk is normally fired to a temperature in excess of 1,000° F. to fuse the electrodes to the disk. Thereafter the terminal assembly is applied to the ceramic body in the manner already described and soldered or pasted for electrical and mechanical integration.

The next step in the process of manufacturing the embodiment of FIGS. 1–3 is to encapsulate the component with an appropriate weatherproof and stable insulating housing. In one preferred manufacturing process, the capacitor is supported by the terminal conductors 14 and 16 and dipped into a liquid body of phenol-formaldehyde resin such as that commercially known as "Durez." Upon removing the component from the resin, it is cured at an appropriate temperature to produce a solid encapsulating housing which will maintain the component free of contamination and degeneration from exposure to the atmosphere. Thereafter the spark gap 22 is formed in the bight portion 34 of the terminal assembly.

In one particular embodiment this is accomplished by merely passing a small sawblade of a predetermined thickness through the bight portion and the associated housing. This produces the air gap 22 as clearly shown in FIG. 1. In the preferred embodiment the air gap 22 is .015 inch and this produces a voltage breakdown characteristic under normal ambient conditions in the order of 2,000 to 3,000 volts D.C.

From the foregoing, it is clear that the described method produces an improved electric component in a more efficient and facile manner. It is also apparent that an improved product results wherein overvoltage protection may be provided by virtue of an air gap displaced from the body of the component and so disposed as to avoid excessive contamination and facilitates cleaning and adjustment, if necessary.

The technique described above may obviously be employed to manufacture many other components or combination of components. For example, a parallel resistance may be included in the construction by locally doping the ceramic substrate 24 to produce a predetermined conductive characteristic between portions of the electrodes 26 and 28. Also, if desired, a parallel resistance, such as that described in the Magnusson et al. Patent No. 2,966,608, can be attained by applying a resistive paint to the surfaces and edge of the ceramic substrate 24 to interconnect electrodes 26 and 28.

Furthermore, if the spark gap overvoltage protection of the described embodiment is not desired in a particular construction, the method described above will nevertheless be highly advantageous in providing improved production, quality, reliability and ease of construction through automatic techniques. In the event that the spark gap protection is not required, a greater portion of the bight portion 34 will be removed prior to encapsulating and the saw cut defining the spark gap 22 will not be formed in the encapsulating housing 12.

Figure 4:
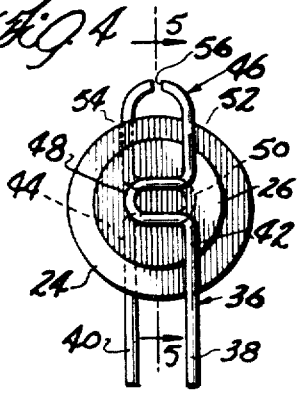
FIG. 4 is a plan view of an alternate embodiment of this invention.
Figure 5:
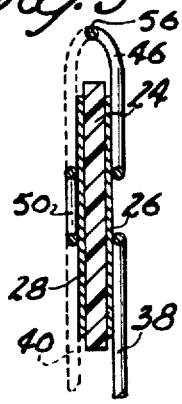
FIG. 5 is a sectional view of the embodiment of FIG. 4 taken on the line 5—5 thereof.

The alternate embodiment of the invention illustrated in FIG. 4 has many characteristics in common with that already described with respect to FIGS. 1 through 3. In this embodiment a terminal assembly 36 having some of the characteristics of a paper clip is formed from a continuous piece of conductive terminal material. The terminal assembly 36 will include flexible terminal portions 38 and 40, intermediate portions 42 and 44 and a bight portion 46. The intermediate portions 42 and 44 include tortuous configurations 48 and 50 which define substantially parallel spaced planes. In the described embodiment the tortuous portions 48 and 50 are simple loops extending into overlapping relationship. Any desired shape which will effectively define two parallel planes will be satisfactory.

The ceramic disk 24 and electrodes 26 and 28, already described with respect to FIG. 2, may be employed in this embodiment and placed between the intermediate portions 42 and 44. It is not essential that the intermediate portions have overlapping relationships shown. However, it is preferred that the intermediate portions 42 and 44 be so shaped that the disk 24 will be gripped and retained in position to facilitate further assembly.

In one embodiment of the invention, the tortuous portions 48 and 50 are completely eliminated and the intermediate [portion] *portions* 42 and 44 are perfectly straight and in alignment with the terminal portions 38 and 40. In this embodiment the disk 24 is readily placed between the two straight terminal legs but must be held in place by auxiliary means for the next step in processing.

With the subassembly as described above complete, the intermediate portions 42 and 44 are fused to the electrodes 26 and 28 either with a conductive paste or by soldering. Thereafter processing of the components is precisely as shown and described with respect to FIGS. 1–3. If a conventional capacitor is desired, the bight portion 46 is removed, preferably along the broken lines 52 and 54. Thereafter the component is encapsulated with any desired material, such as a phenol-formaldehyde resin or an epoxy resin, and the product is complete. If spark gap protection is desired, the component is dipped and cured, as already described, and thereafter a saw cut or the like is formed in the bight portion 46 to define a spark gap 56 and the housing is similarly severed to provide a [somewaht] *somewhat protected* air space between the spaced aligned portions of the bight 46 which define the air gap 56.

Figure 7:
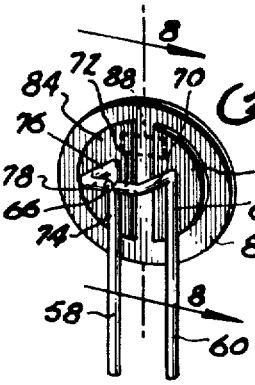
FIG. 7 is a similar view of the embodiment of FIG. 6 with the encapsulation removed.
Figure 8:
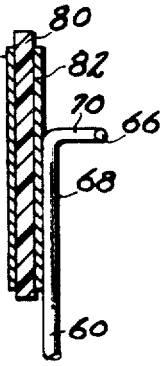
FIG. 8 is an enlarged sectional view of the embodiment of FIG. 6 taken on line 8—8 of FIG. 7.
Figure 6:
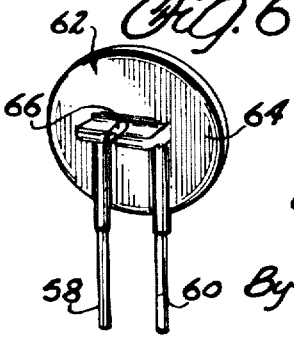
FIG. 6 is a perspective view of another embodiment of the invention.

Still another embodiment of the invention having additional advantages is illustrated in FIGS. 6–8. The component is illustrated in its completed form in FIG. 6 and includes a pair of flexible terminals 58 and 60 which extend into a sealed housing 64. A spark gap 66 is formed adjacent to and spaced from one of the flat faces of the housing 64. The internal construction of this embodiment is more clearly shown in FIG. 7 wherein the flexible terminal portion 60 is integral with an intermediate terminal portion 68 which in turn extends into an offset portion 70 and an aligned electrode portion 72. Flexible terminal 58 is similarly integral with an intermediate portion 74, an offset portion 76 and an aligned electrode portion 78. The aligned portions 72 and 78 define the spark gap 66 which is spaced from the face of a supporting ceramic disk 80. The disk 80 has two flat substantially parallel faces similar to those of disk 24 already described. However in the embodiment of FIG. 7, two electrically separated plates or electrodes 82 and 84 are formed on one face of the disk 80 while a single continuous electrode 86 is formed on the opposite face of the body 80 and overlies substantially all of the electrodes 82 and 84. Thus the ceramic disk 80, which has excellent dielectric properties, cooperates with the plates or electrodes 82, 84 and 86 to define two capacitors connected in series. The plate 82 cooperates with approximately one half of the plate 86 to define a first capacitor. The plate 84 cooperates with the other half of plate 86 to define a second capacitor and the two are connected in series by virtue of the common electrical path through plate 86. Intermediate portion 68 of terminal 60 is fused to electrode 82 in any of the manners heretofore discussed, including pasting or soldering of the intermediate portion 68 to the electrode. Similarly, intermediate portion 74 is fused to plate 84 and thus a circuit may be completed between the flexible terminal conductors 58 and 60 which will include two capacitors in series. The spark gap 66 is connected in parallel with the series capacitors to provide overvoltage protection therefor.

It will be apparent that additional components may be included within the single body, as for example, by placing a small resistive film in the position shown by the broken lines 88. By this modification, a parallel or shunt resistor will be included with the series capacitors and the spark gap 66. It is preferred that the terminal portions 58 and 60, intermediate portions 68 and 74, offset portions 70 and 76, and aligned portions 72 and 78 be formed from a single piece of wire and soldered or otherwise secured in place as a unit. This terminal unit may be readily manufactured on conventional machinery and maintained in position in automatic processing by a relatively simple clamp or jig. Once the terminal unit is soldered in place the encapsulating housing 64 may be applied thereto in a manner already described. Thereafter a small saw cut of precision and known width is formed in the housing and terminal unit to define the air gap 66.

While several distinct embodiments of this invention have been described herein, it will be immediately apparent that many of the novel features and structural and procedural advantages taught herein may be attained under varying conditions. For example, while all of the described embodiments are directed to capacitor construction with the addition of overvoltage protection, resistance or other circuit characteristics, as desired, one may employ narrow or small electrode portions on a substrate having low dielectric properties and thereby substantially eliminate capacitance while including resistance or inductance, as might be desired. Nevertheless, the advantages of simplified construction and a reliable and inexpensive product of improved physical characteristics will result.

Wtihout further elaboration, the foregoing will so fully explain the character of the invention that others may, by applying current knowledge, readily adapt the same for use under varying conditions of service, while retaining certain features which may properly be said to constitute the essential items of novelty involved, which items are intended to be defined and secured by the following claims.

What is claimed is:

[1. A component for use in an electrical circuit comprising a nonconducting base, two generally cylindrical elongated conductors supported by said base at positions intermediate their ends, said conductors having first distal ends facing one another and displaced slightly from said nonconducting base and from one another to form a spark gap, the distance between said support positions and said first ends of the conductors being small enough to provide a relatively rigid structure in the vicinity of said spark gap.]

[2. A component for use in electric circuits comprising a nonconducting base portion having two generally parallel surfaces, two conducting plates positioned respectively on said two parallel surfaces to form a capacitor with said base portion, two generally cylindrical elongated conductors attached respectively to said plates, said conductors having first ends in close proximity to one another to form a spark gap, and second ends for connection in an electric circuit.]

[3. The component of claim 2 further including encapsulating means completely encapsulating said component except for the spark gap and the second ends of the conductors.]

[4. The component of claim 2 wherein said conductors have substantially straight potrions connected to the plates and said straight portions are disposed at an angle to one another.]

[5. The component of claim 2 wherein said conductors have tortuous portions lying in substantially parallel planes, said tortuous portions being connected to said plates and said nonconducting base portion being entrapped between said tortuous portions.]

6. A component for use in an electric circuit comprising a nonconducting base portion having two generally parallel surfaces, two electrically separated conducting plates positioned on one of said parallel surfaces, a third conducting plate positioned on the other of said parallel surfaces to form two series connected capacitors with said other two plates and said base portion, two generally cylindrical elongated conductors connected at positions intermediate their ends to said two conducting plates respectively, said conductors having first ends in relatively close proximity to one another to form a spark gap and second ends adapted for connection in an electric circuit.

7. The component of claim 6 further including encapsulating means completely encapsulating said component except for said spark gap and said second two ends.

*8. A component for use in an electrical circuit including interconnecting conductors comprising a nonconducting base having flat surface portions, a first and a second generally cylindrical elongate flexible conductor, each of said flexible conductors having a portion adjacent a distal end thereof secured to said flat surface portions, the distal end of said first and second flexible conductors being displaced slightly from said nonconducting base and being sufficiently short to provide a relatively rigid cantilever portion, said distal ends being axially aligned and spaced apart to form a spark gap, said flexibe conductors each having a second longer free end extending from said base and having sufficient length and flexibility to permit intertwining for electrical connection with other similar con-*

*ductors and encapsulating insulating material surrounding said base and said distal ends with said free ends extending therefrom, a gap being formed in said encapsulating material surrounding said spark gap and corresponding thereto.*

*9. A component for use in an electrical circuit including interconnecting conductors comprising a first and a second generally cylindrical elongate flexible conductor, each of said conductors having a distal end axially aligned with the corresponding distal end of the other flexible conductor and spaced a predetermined distance therefrom to define a spark gap, each of said flexible conductors having a second, longer free end having sufficient length and flexibility to permit intertwining for electrical connection with other similar flexible conductors, and encapsulating insulating material surrounding the portion of said first and second flexible conductors intermediate said ends and securing said flexible conductors with said distal ends in said axially aligned relationship, said encapsulating materadial also enclosing said distal ends, a gap being formed in said encapsulating material surrounding said spark gap and corresponding thereto.*

*10. A component for use in an electrical circuit including interconnecting conductors comprising a base of rigid nonconducting material having a surface portion, a first and a second generally cylindrical elongate flexible conductor, each of said flexible conductors having a portion adjacent a first distal end thereof secured to said surface portion, the distal end of said first and second flexible conductors extending slightly from said nonconducting base and being sufficiently short to provide a relatively rigid cantilever portion, said distal ends being axially aligned and spaced apart to form a spark gap, said flexible conductors each having a second longer free end extending from said base and having sufficient length and flexibility to permit intertwining for electrical connection with other similar conductors, and nonconducting cementitious material secured to said base and surrounding portions of said first and second conductors intermediate their ends whereby said conductors are secured to said base with said free ends extending therefrom, a gap being formed in said nonconducting material surrounding said spark gap and corresponding thereto.*

References Cited

The following references, cited by the Examiner, are of record in the patented file of this patent or the original patent.

UNITED STATES PATENTS

| | | | |
|---|---|---|---|
| 1,560,510 | 11/1925 | Hirsch | 313—129 X |
| 1,560,512 | 11/1925 | Hirsch | 313—143 X |
| 2,716,198 | 8/1955 | McCallum | 313—231 |
| 3,087,093 | 4/1963 | Bourgerie | 317—12 |
| 3,292,049 | 12/1966 | Lucas | 315—35 X |
| 3,324,347 | 6/1967 | Brugnola | 315—36 X |
| 3,346,762 | 10/1967 | Martin | 315—36 X |
| 1,198,358 | 9/1916 | Knutson | 313—123 |
| 972,564 | 10/1910 | Siemens | 313—36 |
| 2,618,765 | 11/1952 | Vogelsander | 315—36 X |
| 2,783,336 | 2/1957 | Latour | 315—36 X |
| 2,917,662 | 12/1959 | Cunningham | 315—36 |
| 2,936,390 | 5/1960 | Melhart | 313—325 |
| 2,966,608 | 12/1960 | Magnusson et al. | 313—231 |
| 3,045,143 | 7/1962 | Shickel | 313—325 |
| 3,117,297 | 1/1964 | Degier | 317—261 |
| 3,149,263 | 9/1964 | Rabus | 315—36 X |
| 3,159,765 | 12/1964 | Schultz et al. | 315—35 |
| 3,210,588 | 10/1965 | Demurjian | 313—23 X |
| 3,223,874 | 12/1965 | Carpenter | 313—231 |
| 3,230,411 | 1/1966 | Smith | 313—231 |
| 3,246,199 | 4/1966 | Sarbach | 315—36 |
| 3,259,780 | 7/1966 | Stetson | 315—36 |

JOHN W. HUCKERT, Primary Examiner

A. J. JAMES, Assistant Examiner

U.S. Cl. X.R.

313—143, 353; 315—36; 317—62